United States Patent
Kunimoto et al.

(10) Patent No.: US 8,072,778 B2
(45) Date of Patent: Dec. 6, 2011

(54) PLASMA DISPLAY DEVICE

(75) Inventors: Hiroshi Kunimoto, Osaka (JP); Hirotsugu Fusayasu, Kyoto (JP); Shouichi Mimura, Osaka (JP); Kei Ichikawa, Osaka (JP); Masafumi Kumoi, Osaka (JP); Ryo Matsubara, Osaka (JP); Masato Tobinaga, Hyogo (JP); Toshiyuki Nakaie, Osaka (JP)

(73) Assignee: Panasonic Corporation, Osaka (JP)

( * ) Notice: Subject to any disclaimer, the term of this patent is extended or adjusted under 35 U.S.C. 154(b) by 488 days.

(21) Appl. No.: 12/404,388

(22) Filed: Mar. 16, 2009

(65) Prior Publication Data

US 2009/0237907 A1 Sep. 24, 2009

(30) Foreign Application Priority Data

Mar. 24, 2008 (JP) .................. 2008-074897

(51) Int. Cl.
H05K 9/00 (2006.01)

(52) U.S. Cl. ..... 361/818; 345/70; 313/582; 248/346.01; 439/247

(58) Field of Classification Search ............ 345/70, 345/211, 60, 204, 803, 66, 212, 64, 74; 313/582, 313/317, 584, 498; 359/891, 609; 348/790, 348/836, 252; 361/818, 709, 752, 679.27, 361/679.02, 679.05, 679.01, 725, 718; 501/77; 248/346.01, 122.1; 439/247, 70; 349/39, 349/38, 43

See application file for complete search history.

(56) References Cited

U.S. PATENT DOCUMENTS

| 6,160,349 | A | 12/2000 | Nagai |
| 7,830,091 | B2* | 11/2010 | Suzuki et al. ................. 313/582 |
| 2007/0165017 | A1* | 7/2007 | Kubota et al. ................. 345/211 |
| 2008/0007490 | A1* | 1/2008 | Onozawa ........................ 345/70 |
| 2010/0052529 | A1* | 3/2010 | Kim et al. ..................... 313/582 |

FOREIGN PATENT DOCUMENTS

| JP | 10-017081 A | 1/1998 |
| JP | 10-282896 A | 10/1998 |
| JP | 2001-083909 A | 3/2001 |

* cited by examiner

*Primary Examiner* — Hung Duong
(74) *Attorney, Agent, or Firm* — Panasonic Patent Center; Dhiren Odedra; Kerry Culpepper (57) ABSTRACT

A plasma display device capable of reducing an electromagnetic interference wave due to a driving current flowing in a plasma display panel is provided. The plasma display device includes a plasma display panel having electrodes that are parallel to each other, a driver circuit board for applying a voltage to the electrodes, a chassis conductor holding the plasma display panel and to which a ground of the driver circuit board is connected, and a first additional conductor plate provided to the chassis conductor via an insulating layer and to which grounds of at least one circuit board in circuit boards other than the driver circuit board are attached.

10 Claims, 6 Drawing Sheets

PLASMA DISPLAY DEVICE

BACKGROUND

1. Technical Field

The technical field relates to a plasma display device that is known as a thin large-screen display device.

2. Background Art

Spontaneous light-emitting type display devices such as a plasma display device and a CRT display (Cathode-Ray Tube display) device are widely used since they do not have a viewing angle dependency and can display natural images. In particular, a plasma display device is thin and suitable for forming a large screen, and therefore is rapidly becoming widespread.

Conventionally, a plasma display device mainly includes a plasma display module section having a plasma display panel, a chassis conductor holding the plasma display panel, and various circuit boards attached to the chassis conductor, and a shield case surrounding the module.

This plasma display panel excites a phosphor provided in each discharge cell by an ultraviolet ray generated by gas discharge so as to emit visible light as display light. The plasma display panel includes a plurality of electrodes (scan-sustain electrode pairs and address electrodes) which are arranged in a lattice. By emitting light selectively in a discharge cell that is an intersection portion of the electrodes, an image is formed. With this principle, since a large current for driving flows in electrodes, an electromagnetic field is generated from a plasma display module due to this current.

Furthermore, a plasma display device is provided with various signal processing circuit boards for processing an image signal to be transmitted to a plasma display panel. An undesirable electromagnetic field due to a clock signal and the like used in these circuit boards may be generated.

A shield case for shielding from generated electromagnetic fields has a configuration in which, for example, a front glass to which a conductive filter is attached and a conductive back cover at the rear surface side are connected to each other by using a conductive member so as to surround a plasma display module. Thus, the plasma display module is electromagnetically shielded from generated electromagnetic fields.

However, with the increase in driving electric power due to recent improvements in image quality it has been difficult to reliably reduce an electromagnetic field by a conventional shield case. In particular, in low-frequency regions of not higher than several tens MHz, such an electromagnetic field cannot be sufficiently reduced by a conventional shield case and may be radiated to the outside as a noise.

In order to solve such a problem, the following proposition has been made. That is to say, an adjacent conductive cylinder is provided to a ground-return conductor plate connecting between a driving board provided at one end of a plasma display device and a driving board provided at the other end, in which inductance of the ground-return conductor plate is cancelled by an eddy current generated in this adjacent conductive cylinder. Such a proposition is disclosed in, for example, Japanese Patent Unexamined Publication No. 2001-83909.

Furthermore, a method for individually shielding by surrounding a board generating noise by a conductor has been proposed. Such a proposition is disclosed in, for example, Japanese Patent Unexamined Publication No. H10-17081.

Furthermore, a plasma display device having a configuration, in which shielding is carried out by connecting a chassis conductor holding a plasma display panel to a back cover so as to surround a driver circuit board, has been also proposed. Such a proposition is disclosed in, for example, Japanese Patent Unexamined Publication No. H10-282896.

However, in the plasma display device described in Japanese Patent Unexamined Publication No. 2001-83909, when an adjacent conductive cylinder having a size such that a reducing effect for cancelling inductance can be expected is inserted inside the panel and the ground-return conductor plate, an entire area of the loop of a flowing current is enlarged. As a result, electromagnetic fields themselves to be reduced are increased, thus deteriorating the effect of reducing electromagnetic fields.

Furthermore, in a conventional plasma display device, a driving current for driving a plasma display panel flows in a chassis conductor. Therefore, by a cable and the like extending to the outside of the shield case via various circuit boards connected to the chassis conductor, noise caused by the driving current is emitted from the outer side of the shield case. However, it is difficult to reduce this noise.

Furthermore, in plasma display devices disclosed in Japanese Patent Unexamined Publication Nos. H10-17081 and H10-282896, the shielding effect for signal processing circuit board and driver circuit board themselves is increased. However, it is difficult to reduce an electromagnetic field generated by a current flowing between the plasma display panel and the chassis conductor. Furthermore, it is difficult to reduce noise emitted from the outer side of the shield via a cable and the like.

SUMMARY

A plasma display device includes a plasma display panel having an electrode; a driver circuit board for applying a voltage to the electrode; a chassis conductor holding the plasma display panel and providing a ground connection for the driver circuit board; and a first additional conductor plate provided to the chassis conductor via an insulating layer and to which grounds of at least one circuit board in circuit boards other than the driver circuit board are attached.

DETAILED DESCRIPTION OF PREFERRED EMBODIMENT

In view of the problems in the above-mentioned conventional methods, as well as other concerns, a plasma display device according to various embodiments is capable of reducing an electromagnetic interference wave caused by a driving current flowing in a plasma display panel.

Hereinafter, various embodiments are described with reference to drawings. Note here that the same reference numerals are given to components carrying out the same operations in each embodiment, and description thereof may not be repeated.

First Embodiment

Figure 1:
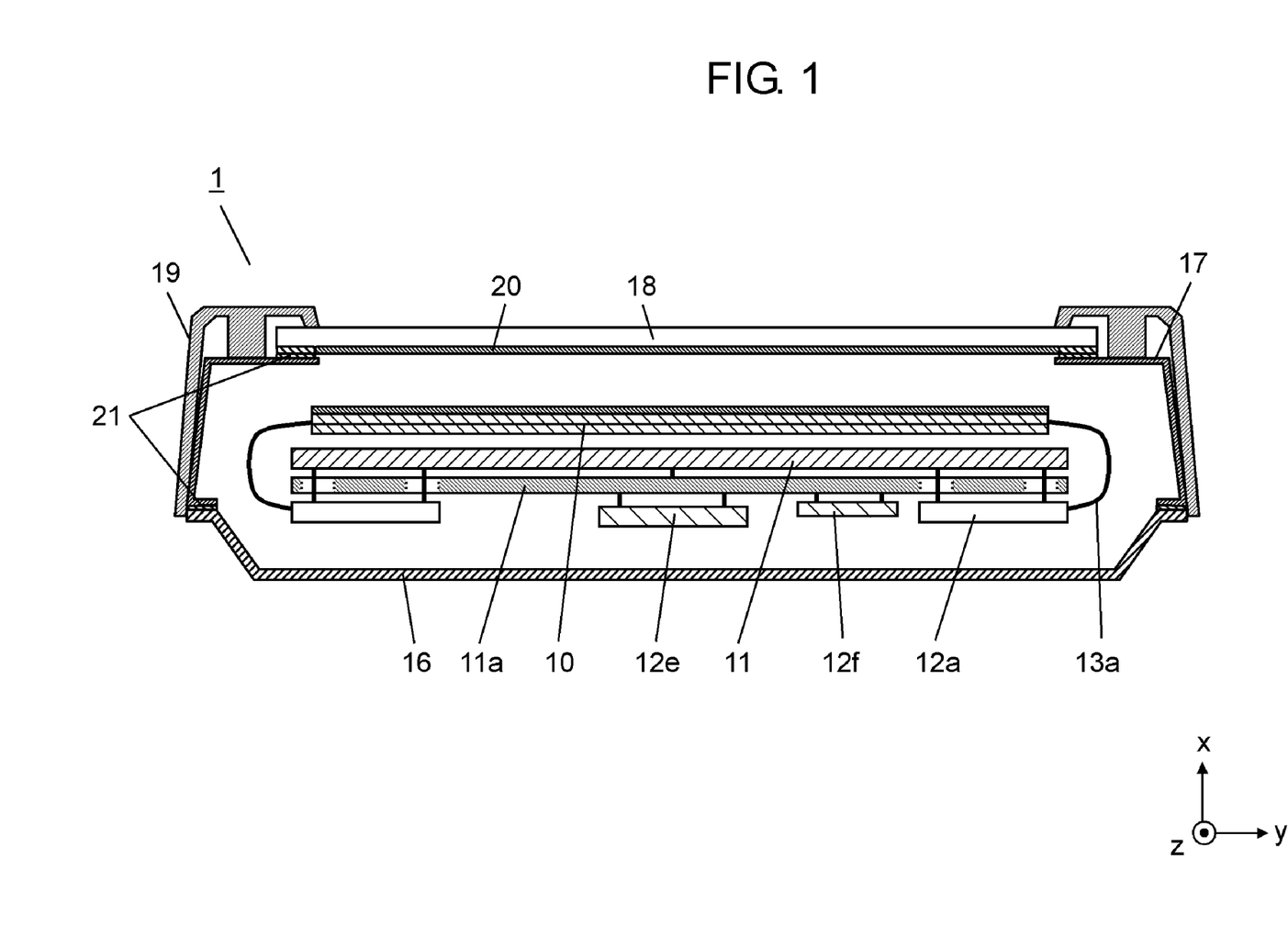
FIG. 1 is a cross-sectional schematic view illustrating a configuration of a plasma display device in accordance with a first embodiment.
Figure 2:
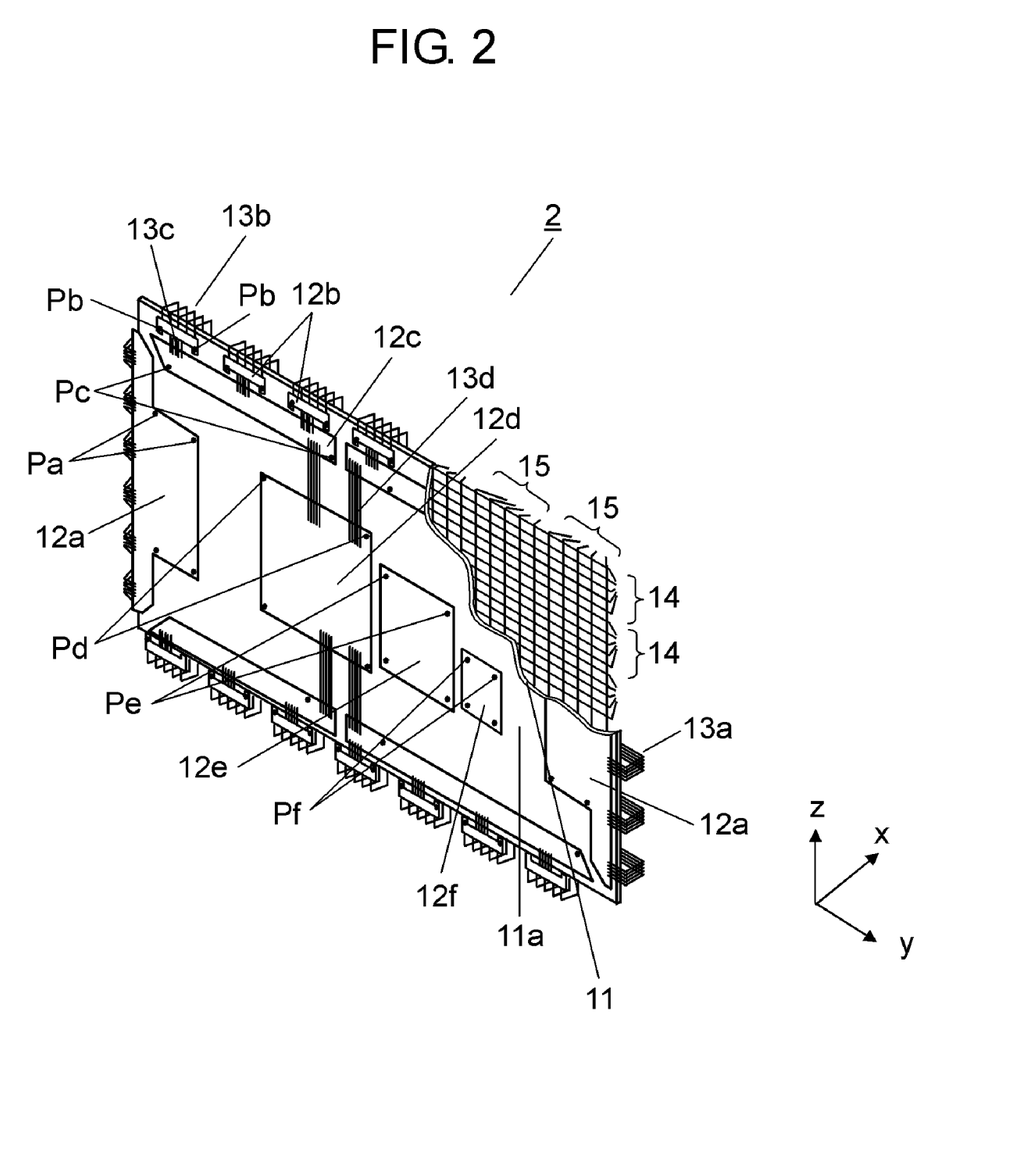
FIG. 2 is a perspective view illustrating a configuration of a plasma display module.
Figure 3A:
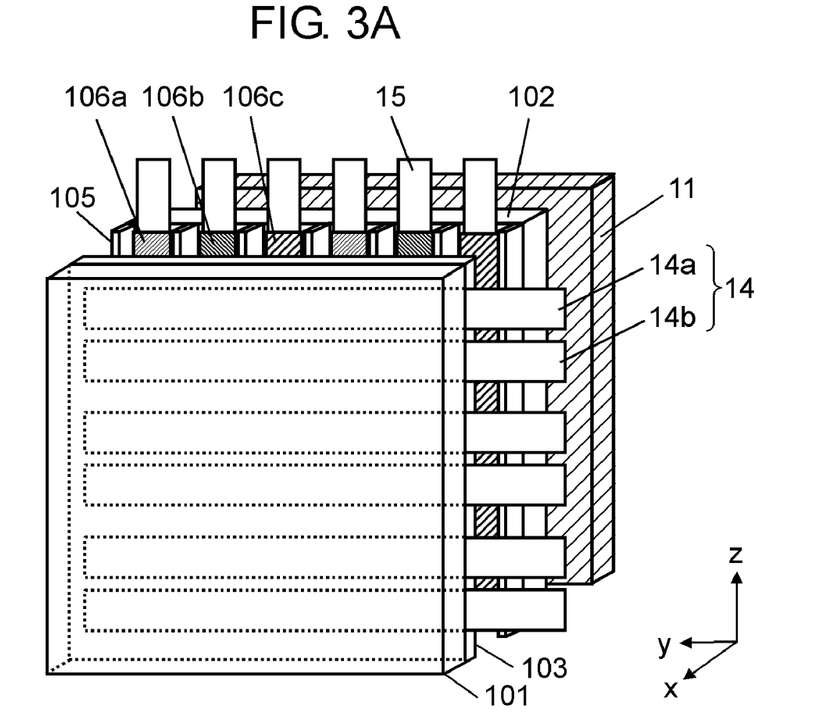
FIG. 3A is a perspective view illustrating an electrode structure of a plasma display panel in the plasma display device in accordance with the first embodiment.
Figure 3B:
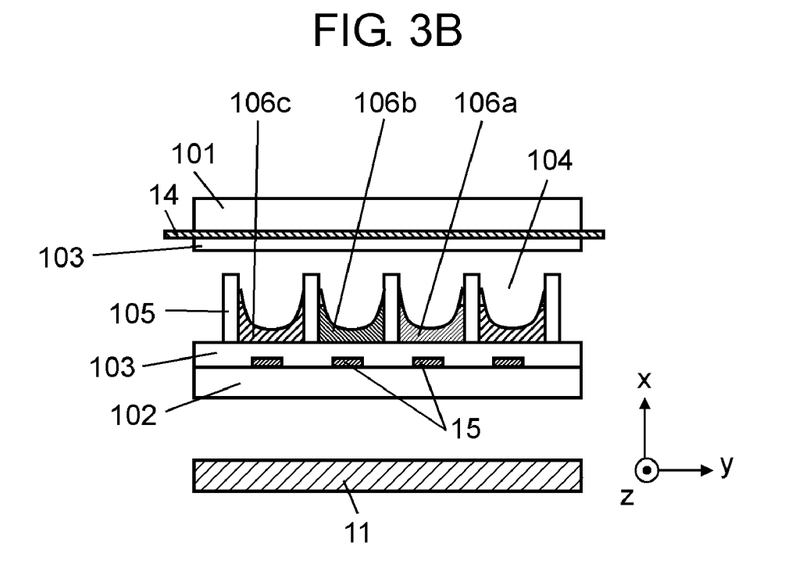
FIG. 3B is a sectional view illustrating an electrode structure of a plasma display panel in the plasma display device in accordance with the first embodiment.
Figure 4:
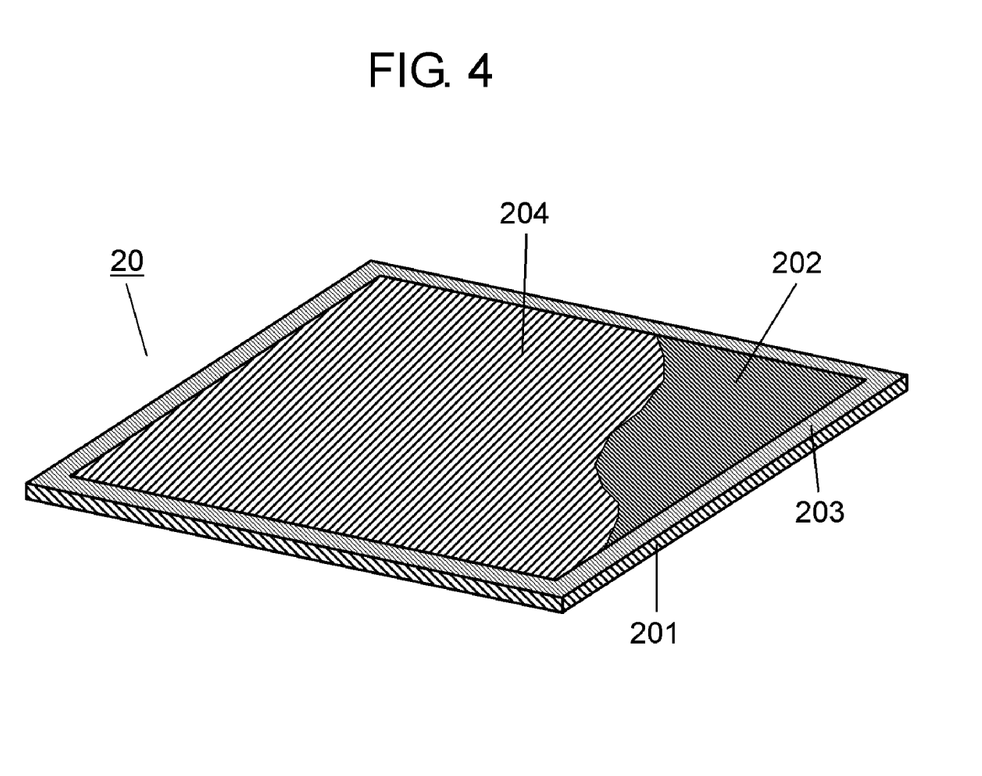
FIG. 4 is a perspective view illustrating a structure of a conductive front filter.

FIGS. 1 to 4 show a plasma display device in accordance with the first embodiment. FIG. 1 is a cross-sectional schematic view illustrating a configuration of a plasma display device in accordance with the first embodiment, showing only the structures deeply related to emission of undesirable electromagnetic waves. FIG. 2 is a perspective view illustrating a configuration of a plasma display module in a plasma display device in accordance with the first embodiment. FIG. 3A is a perspective view illustrating an electrode structure of a plasma display panel in the plasma display device in accordance with the first embodiment, and FIG. 3B is a sectional view thereof. FIG. 4 is a perspective view illustrating a structure of a conductive front filter in the plasma display device in accordance with the first embodiment. Note here that "x," "y" and "z" in FIGS. 1, 2, 3A and 3B show three directions perpendicular to each other. "x" denotes the same direction in these figures; "y" denotes the same direction in these figures; and "z" denotes the same direction in these figures.

In FIGS. 1 and 2, in plasma display module 2 in plasma display device 1 in accordance with the first embodiment, chassis conductor 11 as a holder plate of plasma display panel 10 is disposed on the side of a non-display surface of plasma display panel 10 via a thermal conductive sheet (not shown). Plasma display panel 10 has scan-sustain electrodes 14 that are parallel to each other in the longitudinal direction and address electrodes 15 that are parallel to each other in the short direction.

Furthermore, first additional conductor plate 11a is provided on chassis conductor 11 at the side opposite to a display surface. First additional conductor plate 11a is electrically connected to chassis conductor 11 at one point as ground connection.

Scan-sustain electrodes driver circuit board 12a, address electrode driver circuit board 12b, junction circuit board 12c, and discharge control circuit board 12d, power circuit board 12e and image signal processing circuit board 12f are disposed at a rear surface side of first additional conductor plate 11a. However, the ground of scan-sustain electrodes driver circuit board 12a is electrically connected to chassis conductor 11 without being connected to first additional conductor plate 11a. A driving signal generated by scan-sustain electrodes driver circuit board 12a is transmitted to scan-sustain electrodes 14 of plasma display panel 10 by flexible cable 13a. A high frequency signal generated by discharge control circuit board 12d is transmitted to junction circuit board 12c by flexible cable 13d and then transmitted to address electrode driver circuit board 12b by flexible cable 13c. Address electrode driver circuit board 12b generates a driving signal and the driving signal is transmitted to address electrode 15 of plasma display panel 10 by flexible cable 13b.

As shown in FIGS. 3A-3B, plasma display panel 10 has a structure in which front glass plate 101 and rear glass plate 102 are attached to each other. Dielectric layer 103 is formed on front glass plate 101. A large number of scan-sustain electrodes 14 each consisting of scan electrode 14a and sustain electrode 14b are formed in a way in which they are protected by dielectric layer 103. Dielectric layer 103 is formed also on rear glass plate 102. Similarly a large number of address electrodes 15 are formed in a way in which they are protected by dielectric layer 103.

A portion that is a crossing position of scan-sustain electrodes 14 and address electrode 15 and that is surrounded by scan-sustain electrodes 14 and address electrode 15 is discharge cell 104. Discharge cell 104 is filled with a discharge gas including a noble gas such as helium (He), neon (Ne) and xenon (Xe). Discharge cells 104 are defined by barrier ribs 105 and the inside of each discharge cell is differently colored by red phosphor 106a, blue phosphor 106b and green phosphor 106c.

Chassis conductor 11 is made of a plate of metal such as aluminum and copper having high thermal conductivity and electrical conductivity. One surface (display surface side) of chassis conductor 11 is provided with plasma display panel 10 via a thermal conductive sheet. The other surface thereof (rear surface side) and a ground of scan-sustain electrodes driver circuit board 12a are connected to each other with first additional conductor plate 11a sandwiched therebetween. Therefore, chassis conductor 11 holds plasma display panel 10 and functions as not only a reinforcing member for maintaining strength but also an electrical ground of scan-sustain electrodes driver circuit board 12a. For example, a signal ground of scan-sustain electrodes driver circuit board 12a is grounded to chassis conductor 11 as a frame ground at point Pa.

First additional conductor plate 11a is made of a plate of metal such as aluminum and copper having high thermal conductivity and electrical conductivity. A rear surface side of first additional conductor plate 11a is connected to grounds of boards other than scan-sustain electrodes driver circuit board 12a. Therefore, first additional conductor plate 11a functions as electrical grounds of boards other than scan-sustain electrodes driver circuit board 12a. For example, a signal ground of address electrode driver circuit board 12b, a signal ground of junction circuit board 12c and a signal ground of discharge control circuit board 12d are grounded to additional conductor plate 11a as a frame ground at points Pb, Pc and Pd, respectively. Furthermore, a signal ground of power circuit board 12e and a signal ground of image signal processing circuit board 12f are grounded to additional conductor plate 11a as a frame ground at points Pe and Pf, respectively.

As shown in FIG. 4, conductive front filter 20 includes base layer 201, conductive layer 202, metal end portion 203 and protective film 204. Base layer 201 is made of, for example, polyester film. Conductive layer 202 is formed on base layer 201 by metal mesh such as copper mesh, or by sputtering. Metal end portion 203 is formed on the peripheries of conductive layer 202. Protective film 204 is formed of a transparent insulating resin on conductive layer 202. Since metal end portion 203 is not covered with protective film 204, it functions as an electric connection portion.

Note here that conductive layer 202 is formed by using, for example, a copper mesh as a metal mesh, and by silver sputtering as sputtering. When the metal mesh is used, a higher shielding effect can be obtained because the resistivity is low.

Front glass 18 is disposed on the front surface side of plasma display panel 10. On the rear surface (opposite side to the display surface) thereof, conductive front filter 20 is attached.

Glass pressing metal 17 fixes front glass 18 by sandwiching front glass 18 between glass pressing metal 17 and front cabinet 19. Glass pressing metal 17 is disposed in a way in which it is brought into electrical contact with metal end portion 203 of conductive front filter 20 attached to front glass 18 via conductive gasket 21 as a conductive contacting member. Furthermore, glass pressing metal 17 is also brought into contact with back cover 16 via conductive gasket 21.

Note here that conductive gasket 21 is made by, for example, attaching metal fiber to an elastic material like a sponge. Herein, conductive gasket 21 is used as a conductive contacting member, but the member is not necessarily limited to this. That is to say, any members having an electrical conductivity and securing stability in electrical contact between two members may be used. For example, glass pressing metal 17 may be provided with a conductive spring portion. In this case, the cost can be lowered.

Back cover 16 is formed by press molding a conductive metal plate, and is fixed to glass pressing metal 17 so as to cover the rear surface of plasma display panel 10 and driver circuit boards, and the like. Such a configuration plays a role of blocking electromagnetic waves emitted from plasma display panel 10 and driver circuit boards, and the like.

Herein, in plasma display device 1 in accordance with the first embodiment, the principle and operation in which undesirable emission of an electromagnetic interference wave due to a driving current is reduced are described based on the operation principle of a plasma display panel.

Firstly, the principle of an image display of plasma display panel 10 is described. Firstly, a voltage is applied to all lines of scan electrodes 14a so as to carry out initializing discharge causing discharge in all discharge cells. Next, a voltage is sequentially applied to scan electrodes 14a and a voltage is also applied to address electrode 15 that intersects with a discharge cell to emit light on a scan electrode to which a voltage has been applied. This is called address discharge, and a discharge cell in a position where scan electrode 14a to which a voltage has been applied and address electrode 15 intersect with each other emits light, and this discharge cell is selected as a light emission cell. Thereafter, sustain discharge, in which an AC voltage is applied between scan electrode 14a and sustain electrode 14b, is carried out. By sustain discharge, only a light emitting cell selected previously emits light, and plasma display panel 10 displays an image.

Figure 5:
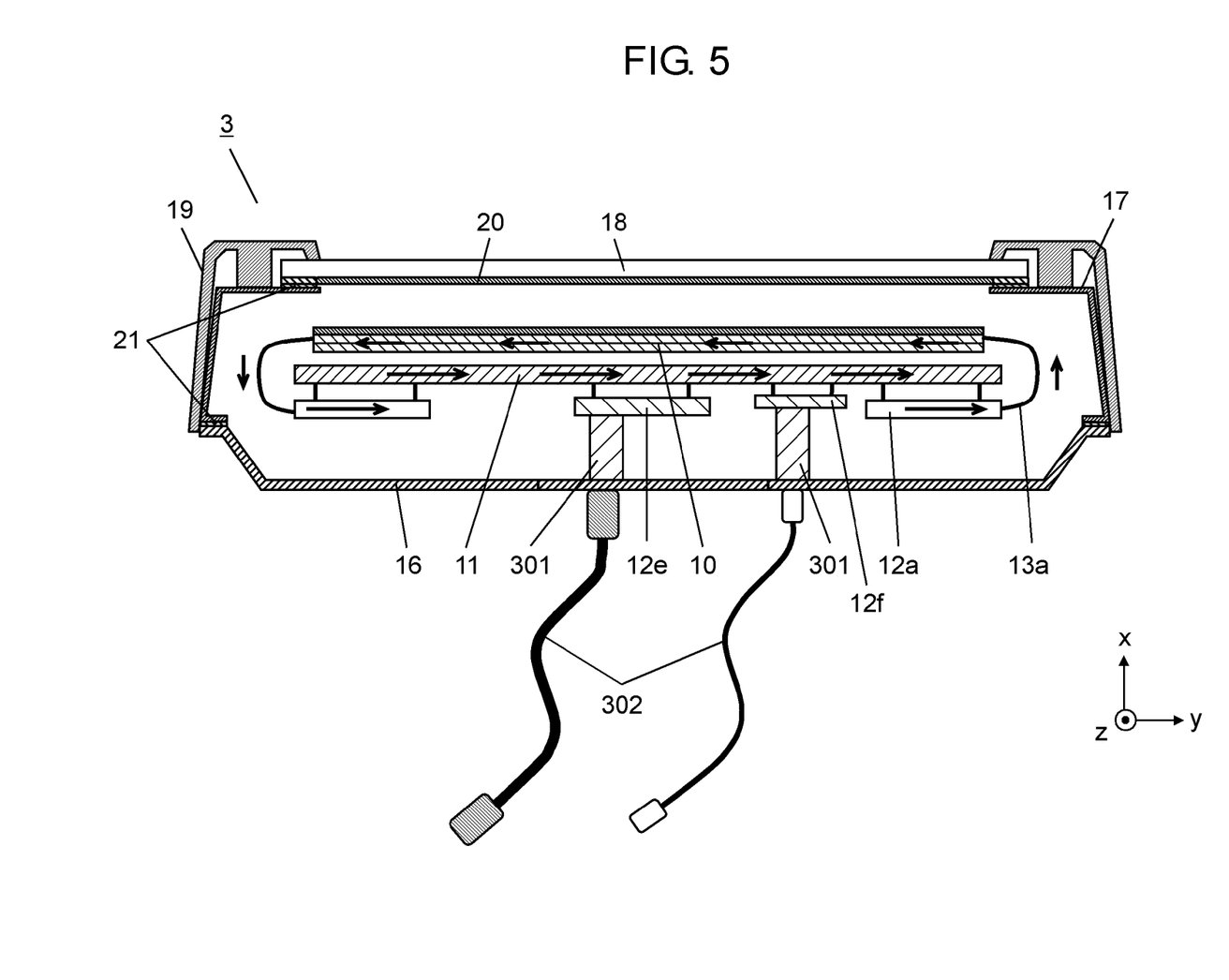
FIG. 5 is a view illustrating a plasma display device and a flow of a panel driving current in a related art configuration.

Next, the principle and operation in which undesirable emission of electromagnetic interference waves due to a driving current is reduced are described with reference to FIG. 5. FIG. 5 is a view showing plasma display device 3 and a flow of a panel driving current in a related art configuration. Note here that "x," "y" and "z" in FIG. 5 show three directions perpendicular to each other. "x" in FIG. 5 is the same direction as "x" in FIGS. 1, 2, 3A and 3B. "y" in FIG. 5 is the same direction as "y" in FIGS. 1, 2, 3A and 3B. "z" in FIG. 5 is the same direction as "z" in FIGS. 1, 2, 3A and 3B.

In the configuration of FIG. 5, a driving current driven by scan-sustain electrodes driver circuit board 12a flows in flexible cable 13a, scan-sustain electrodes 14 (not shown in FIG. 5) of plasma display panel 10 and chassis conductor 11 as shown by an arrow in FIG. 5.

Herein, circuit boards other than scan-sustain electrodes driver circuit board 12a, for example, power circuit board 12e or image signal processing circuit board 12f, are also connected to chassis conductor 11. Cable 302 from the outside is connected to these boards via connector 301. Then, a driving current flowing in chassis conductor 11 flows into cable 302 via grounds (not shown in FIG. 5) of power circuit board 12e or image signal processing circuit board 12f. Then, the driving current reaches the outside of back cover 16 to generate noise emission to the outside of the plasma display device.

Furthermore, even if cable 302 is not connected, since a driving current flows in chassis conductor 11 itself, chassis conductor 11 is unstable as a signal ground of power circuit board 12e and image signal processing circuit board 12f.

Therefore, these boards (power circuit board 12e and image signal processing circuit board 12f) themselves are an emission source of noise so that noise may be generated from gap of the shield case and the like. Furthermore, a driving current flows into image signal processing circuit board 12f to generate an undesirable image signal, which may cause an image disturbance.

Furthermore, chassis conductor 11 itself through which a large driving current flows may be an emission source of noise.

In the first embodiment shown in FIGS. 1 to 4, first additional conductor plate 11a is provided and functions as a signal ground of a circuit board other than scan-sustain electrodes driver circuit board 12a. Herein, since a driving current flowing in chassis conductor 11 is electrically connected to first additional conductor plate 11a at one point, it mainly flows in chassis conductor 11 and hardly flows in first additional conductor plate 11a. Therefore, even when a cable is connected to power circuit board 12e or image signal processing circuit board 12f, it is possible to reduce the flow of driving current. Thus, the emission of noise can be reduced.

Furthermore, since an undesirable current does not flow into signal grounds of power circuit board 12e and image signal processing circuit board 12f and the grounds are stable, it is possible to reduce the above-mentioned generation of noise or image disturbance.

Furthermore, in the first embodiment, first additional conductor plate 11a is provided on the rear surface side of chassis conductor 11. Therefore, first additional conductor plate 11a can function as a shield with respect to noise emitted from chassis conductor 11 itself through which a driving current flows, and thus noise can be reduced.

Note here that it is preferable that an area of a plane having a maximum area in first additional conductor plate 11a is equal to or larger than an area of a plane having a maximum area of chassis conductor 11. This is because first additional conductor plate 11a can stably maintain low impedance as a signal ground, and the effect as a shield mentioned above can be further achieved.

Note here that the first embodiment describes a configuration in which only scan-sustain electrodes driver circuit board 12a is connected to chassis conductor 11. However, the configuration is not necessarily limited to this. For example, only power circuit board 12e may be connected to first additional conductor plate 11a. Power circuit board 12e and image signal processing circuit board 12f may be connected to first additional conductor plate 11a. Thus, other boards can be connected to chassis conductor 11. Thus, a driving current at the time of address discharge by address electrode driver circuit board 12b and the like can be separated from power circuit board 12e and image signal processing circuit board 12f. Thus, it is possible to reduce noise due to address discharge.

Note here that scan-sustain electrodes 14 and address electrode 15 are referred to as an electrode. Furthermore, scan-sustain electrodes driver circuit board 12a for applying a voltage so as to drive scan-sustain electrodes 14, and address electrode driver circuit board 12b for applying a voltage so as to drive address electrode 15 are collectively referred to as a driver circuit board. That is to say, the driver circuit board applies a voltage to an electrode.

Second Embodiment

Next, a second embodiment is described with reference to FIG. 6. Plasma display device 4 in accordance with the second embodiment is different from plasma display device 1 in accordance with the first embodiment in that second additional conductor plate 11b is further provided.

Figure 6:
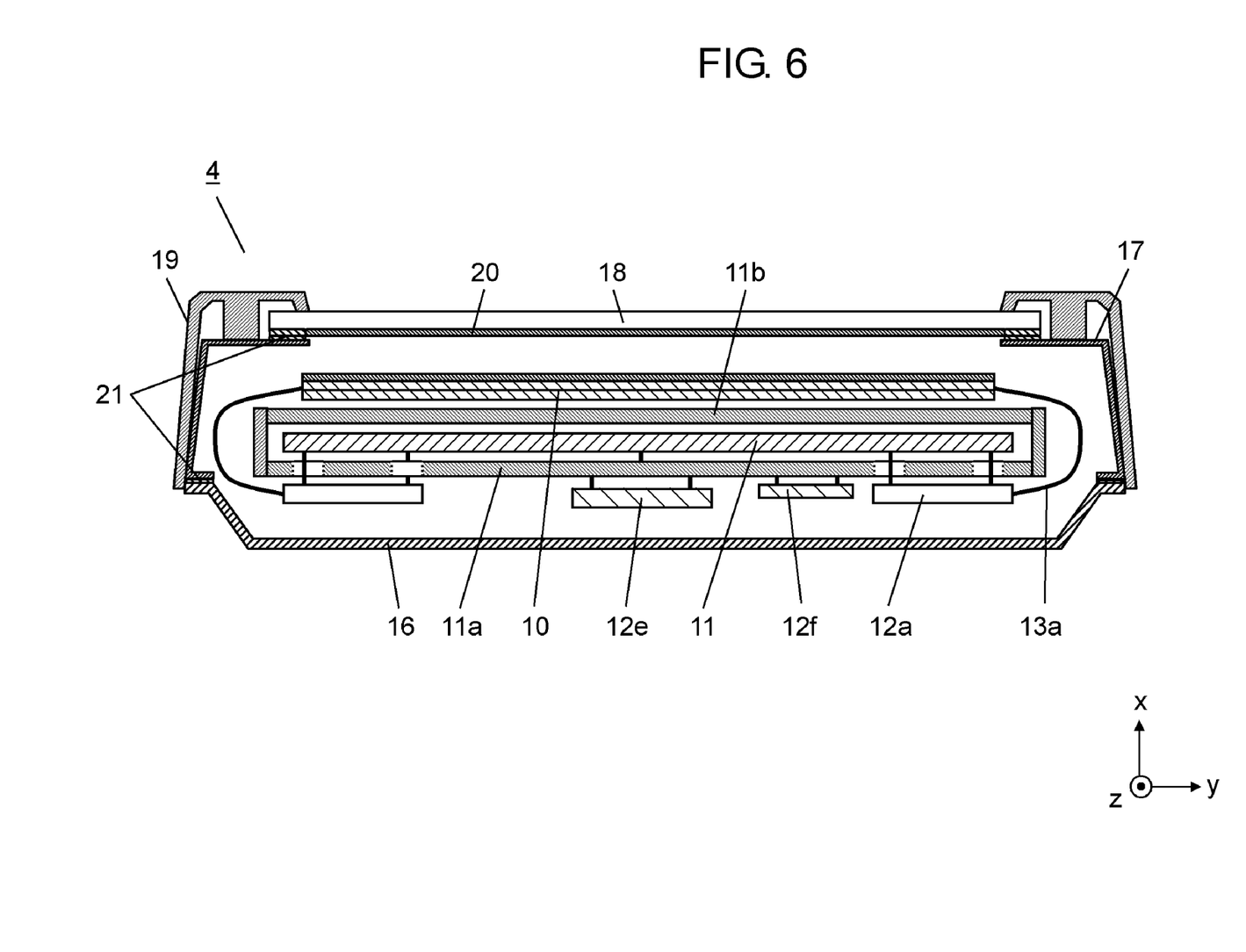
FIG. 6 is a sectional schematic view illustrating a configuration of a plasma display device in accordance with a second embodiment.

FIG. 6 is a sectional schematic view illustrating a configuration of plasma display device 4 in accordance with the second embodiment. Note here that "x," "y" and "z" in FIG. 6 show three directions perpendicular to each other. "x" in FIG. 6 is the same direction as "x" in FIGS. 1, 2, 3A and 3B. "y" in FIG. 6 is the same direction as "y" in FIGS. 1, 2, 3A and 3B. "z" in FIG. 6 is the same direction as "z" in FIGS. 1, 2, 3A and 3B.

In the second embodiment, second additional conductor plate 11b as a holder plate of plasma display panel 10 is disposed on the side of a non-display surface of plasma display panel 10 via a thermal conductive sheet (not shown). Chassis conductor 11 is disposed to second additional conductor plate 11b via a thermal conductive sheet (not shown). First additional conductor plate 11a is provided on the rear surface side of chassis conductor 11 and is electrically connected to chassis conductor 11 at one point as ground connection.

First additional conductor plate 11a and second additional conductor plate 11b are connected to each other at four sides and surround chassis conductor 11 as a whole.

The other components shown in FIG. 6 are the same as the above-mentioned components of the first embodiment shown in FIGS. 1 and 2. Only the ground of scan-sustain electrodes driver circuit board 12a is electrically connected to chassis conductor 11 without being connected to first additional conductor plate 11a. The grounds of the other boards are connected to first additional conductor plate 11a.

According to the second embodiment, chassis conductor 11 is surrounded by first additional conductor plate 11a and second additional conductor plate 11b. Therefore, it is possible to increase the effect as shield with respect to a noise emitted from chassis conductor 11 itself through which a large driving current flows. Thus, it is possible to further reduce noise.

Furthermore, since first additional conductor plate 11a and second additional conductor plate 11b are connected to each other, a board connected to first additional conductor plate 11a can be provided with a stable and low-impedance ground. Therefore, even when a cable is connected to power circuit board 12e or image signal processing circuit board 12f, it is possible to reduce the flow of a driving current and to reduce the emission of noise.

Furthermore, since an undesirable current does not flow into signal grounds of power circuit board 12e and image signal processing circuit board 12f and the grounds are further stable, it is possible to reduce the above-mentioned generation of noise or image disturbance.

Note here that in the second embodiment, first additional conductor plate 11a and second additional conductor plate 11b are connected to each other at four sides and surround chassis conductor 11 as a whole. However, the plasma display device is not necessarily limited to this configuration. That is to say, only two sides at right and left or two sides at the upper and lower sides may be connected to each other. In other words, any configurations may be employed as long as second additional conductor plate 11b and first additional conductor plate 11a may be connected to each other on the peripheries of the end portions so as to surround chassis conductor 11.

Furthermore, in the second embodiment, only scan-sustain electrodes driver circuit board 12a is connected to chassis conductor 11. However, the configuration is not necessarily limited to this. For example, only power circuit board 12e may be connected to first additional conductor plate 11a, or only power circuit board 12e and image signal processing circuit board 12f may be connected to first additional conductor plate 11a. Thus, it is possible to connect other boards to chassis conductor 11. Thus, a driving current at the time of address discharge by address electrode driver circuit board 12b can be separated from power circuit board 12e and image signal processing circuit board 12f. Consequently, noise caused by address discharge can be reduced.

Note here that scan-sustain electrodes 14 and address electrode 15 are referred to as an electrode. Furthermore, scan-sustain electrodes driver circuit board 12a for applying a voltage to drive scan-sustain electrodes 14 and address electrode driver circuit board 12b for applying a voltage to drive address electrode 15 are collectively referred to as a driver circuit board. That is to say, a driver circuit board applies a voltage to electrodes.

Specific numeric values used in the above-mentioned embodiments are just examples and can be appropriately set to optimum values according to the properties of a display device, specification of an image display device, and the like.

The above-mentioned embodiments are merely examples. The plasma display device is not limited to the above-mentioned embodiments and can be modified variously.

As is apparent from the above description, by separating a chassis conductor through which a driving current flows and a ground of a circuit board and the like from each other, it is possible to provide a plasma display device capable of efficiently reducing electromagnetic interference waves caused by a driving current flowing in a plasma display panel.

What is claimed is:

1. A plasma display device, comprising:
   a plasma display panel having an electrode;
   a driver circuit board for applying a voltage to the electrode;
   a chassis conductor holding the plasma display panel and to which a ground of the driver circuit board is connected; and
   a first additional conductor plate provided to the chassis conductor via an insulating layer and to which grounds of at least one circuit board in circuit boards other than the driver circuit board are attached.

2. The plasma display device of claim 1, further comprising:
   a second additional conductor plate provided at an opposite side to the first additional conductor plate seen from the chassis conductor,
   wherein the second additional conductor plate and the first additional conductor plate are connected to each other at peripheries of end portions thereof so as to surround the chassis conductor.

3. The plasma display device of claim 1,
   wherein the first additional conductor plate is provided at an opposite side to the plasma display seen from the chassis conductor.

4. The plasma display device of claim 2,
   wherein the first additional conductor plate is provided at an opposite side to the plasma display seen from the chassis conductor.

5. The plasma display device of claim 1, wherein the first additional conductor plate has an area of a plane having a maximum area of the first additional conductor plate that is not smaller than an area of a plane having a maximum area of the chassis conductor.

6. The plasma display device of claim 2,
   wherein the first additional conductor plate has an area of a plane having a maximum area of the first additional conductor plate that is not smaller than an area of a plane having a maximum area of the chassis conductor.

7. A plasma display device, comprising:
a plasma display panel including an electrode;
a driver circuit board for applying a voltage to the electrode;
at least one other circuit board;
a chassis conductor holding the plasma display panel; and
a first additional conductor plate connected to the chassis conductor via an insulating layer,
wherein the chassis conductor electrically grounds the driver circuit board,
wherein the first additional conductor plate electrically grounds the other circuit board.

8. The plasma display device of claim 7, further comprising an image signal processing circuit board, wherein the other circuit board is a power circuit board, wherein the first additional conductor plate electrically grounds the image signal processing circuit board.

9. The plasma display device of claim 7, wherein
a first surface of the chassis conductor is disposed behind the display panel via a thermal conductive sheet and an opposite surface of the chassis conductor is connected to the first additional conductor plate and to the driver circuit board to electrically ground the driver circuit board,
the other circuit board is disposed behind the opposite surface of the chassis conductor.

10. The plasma display device of claim 7, further comprising an address electrode driver circuit board, a junction circuit board, a discharge control circuit board and an image signal processing circuit board disposed behind a surface of the chassis conductor, wherein the other circuit board is a power circuit board, wherein the first additional conductor plate electrically grounds the address electrode driver circuit board, the junction circuit board, the discharge control circuit board and the image signal processing circuit board.

* * * * *